(12) United States Patent
Mieher et al.

(10) Patent No.: US 9,081,287 B2
(45) Date of Patent: Jul. 14, 2015

(54) METHODS OF MEASURING OVERLAY ERRORS IN AREA-IMAGING E-BEAM LITHOGRAPHY

(71) Applicant: KLA-TENCOR CORPORATION, Milpitas, CA (US)

(72) Inventors: Walter D. Mieher, Los Gatos, CA (US); Allen Carroll, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 59 days.

(21) Appl. No.: 13/874,266

(22) Filed: Apr. 30, 2013

(65) Prior Publication Data

US 2014/0199618 A1 Jul. 17, 2014

Related U.S. Application Data

(60) Provisional application No. 61/740,052, filed on Dec. 20, 2012.

(51) Int. Cl.
| | | |
|---|---|---|
| *G03F 1/20* | (2012.01) | |
| *G03F 7/20* | (2006.01) | |
| *G03F 9/00* | (2006.01) | |

(52) U.S. Cl.
CPC ............ *G03F 7/2059* (2013.01); *G03F 1/20* (2013.01); *G03F 7/70633* (2013.01)

(58) Field of Classification Search
CPC ...... G03F 1/20; G03F 7/2059; G03F 7/70633
USPC .................................. 430/5, 22, 30, 296, 942
See application file for complete search history.

(56) References Cited

U.S. PATENT DOCUMENTS

| | | | |
|---|---|---|---|
| 5,498,500 | A | 3/1996 | Bae |
| 5,939,226 | A | 8/1999 | Tomimatu |
| 6,165,656 | A | 12/2000 | Tomimatu |
| 6,630,681 | B1 | 10/2003 | Kojima |
| 6,778,275 | B2 | 8/2004 | Bowes |
| 6,928,628 | B2 | 8/2005 | Seligson et al. |
| 7,065,737 | B2 * | 6/2006 | Phan et al. ................. 430/22 |
| 7,378,671 | B2 | 5/2008 | Muraki et al. |
| 7,463,367 | B2 | 12/2008 | Bowes |
| 7,564,557 | B2 | 7/2009 | Mieher et al. |
| 7,724,370 | B2 | 5/2010 | Mos et al. |
| 8,107,079 | B2 | 1/2012 | Ausschnitt et al. |
| 8,159,650 | B2 | 4/2012 | Okita et al. |
| 2003/0223630 | A1 | 12/2003 | Adel et al. |
| 2005/0247884 | A1 | 11/2005 | Nakamura et al. |
| 2011/0200246 | A1 | 8/2011 | Van De Kerkhof et al. |
| 2012/0154773 | A1 | 6/2012 | Beyer |

FOREIGN PATENT DOCUMENTS

| | | |
|---|---|---|
| EP | 1817544 A2 | 8/2007 |
| EP | 1866691 A1 | 12/2007 |
| WO | WO 2006/044320 A2 | 4/2006 |
| WO | WO 2006/105667 A1 | 4/2006 |
| WO | 2011012412 A1 | 2/2011 |
| WO | WO 2011/012412 A1 | 2/2011 |

OTHER PUBLICATIONS

PCT International Search Report and Written Opinion of the International Searching Authority for Application No. PCT/US2013/076706, Oct. 6, 2014, 9 sheets.

* cited by examiner

*Primary Examiner* — Christopher Young
(74) *Attorney, Agent, or Firm* — Okamoto & Benedicto LLP

(57) ABSTRACT

One embodiment relates to a method of measuring overlay errors for a programmable pattern, area-imaging electron beam lithography apparatus. Patterned cells of an overlay measurement target array may be printed in swaths such that they are superposed on patterned cells of a first (base) array. In addition, the overlay array may have controlled-exposure areas distributed within the swaths. The superposed cells of the overlay and base arrays are imaged. The overlay errors are then measured based on distortions between the two arrays in the image data. Alternatively, non-imaging methods, such as using scatterometry, may be used. Another embodiment relates to a method for correcting overlay errors for an electron beam lithography apparatus. Overlay errors for a pattern to be printed are determined based on within-swath exposure conditions. The pattern is then pre-distorted to compensate for the overlay errors. Other embodiments, aspects and features are also disclosed.

21 Claims, 15 Drawing Sheets

Overlay target *702*

Overlay target *704*

Overlay target *706*

Overlay target *708*

Pattern recognition target *710*

Pattern recognition target *712*

Frame-inframe overlay target *722*

Line-over-line overlay target *724*

Cross-in-frame overlay target *726*

US 9,081,287 B2

METHODS OF MEASURING OVERLAY ERRORS IN AREA-IMAGING E-BEAM LITHOGRAPHY

CROSS-REFERENCE TO RELATED APPLICATION(S)

The present application claims the benefit of US. Provisional Application No. 61/740,052, filed on Dec. 20, 2012, entitled "Method of Measuring Overlay Errors Due to Aberrations and Space Charge Effects for Area-Imaging Electron Beam Lithography System," the disclosure of which is hereby incorporated by reference.

STATEMENT REGARDING FEDERALLY SPONSORED RESEARCH OR DEVELOPMENT

This invention was made with Government support under Agreement No. HR0011-07-9-0007 awarded by DARPA. The Government has certain rights in the invention.

BACKGROUND OF THE INVENTION

1. Field of the Invention

The present invention relates to programmable-pattern area-imaging electron beam (e-beam) lithography.

2. Description of the Background Art

One type of e-beam lithography system uses point sources or shaped beams for writing specific shapes. With a point source or shaped beam, the beam is not influenced by space-charge or other effects due to the presence of closely neighboring beams. Another type of e-beam lithography system uses fixed electron transmission stencil masks.

Another type of e-beam lithography system is a programmable-pattern area-imaging type which uses a collection of electron beams (i.e. a patterned beam covering an area) to print a pattern swath by swath on a substrate. Programmable-pattern area-imaging electron beam lithography systems include programmable electron-beam reflection systems, programmable electron-beam transmission systems, and programmable electron-beam emission systems.

SUMMARY

One embodiment relates to a method of measuring overlay errors for a programmable pattern, area-imaging electron beam lithography apparatus. Patterned cells of an overlay measurement target array may be printed in swaths such that they are superposed on patterned cells of a first (base) array. In addition, the overlay array may have controlled-exposure areas distributed within the swaths. The superposed cells of the overlay and base arrays are imaged. The overlay errors are then measured based on distortions between the two arrays in the image data. Alternatively, non-imaging methods, such as using scatterometry, may be used.

Another embodiment relates to a method for correcting overlay errors for an programmable pattern, area-imaging electron beam lithography apparatus. Overlay errors for a pattern to be printed are determined based on within-swath exposure conditions. The pattern rendering is then pre-distorted or pre-compensated to compensate for the overlay errors.

Other embodiments, aspects and features are also disclosed.

DETAILED DESCRIPTION

With programmable pattern area-imaging e-beam lithography, there may be several error sources, including space-charge effects, defocusing, and aberrations. Such error sources may cause the relative positions of the electrons that expose different areas of the pattern to be different from the ideal positions, resulting in undesirable pattern distortion which may be referred to herein as "overlay errors". Techniques for the measurement and correction of overlay errors for area-imaging e-beam lithography are disclosed herein.

Figure 1:
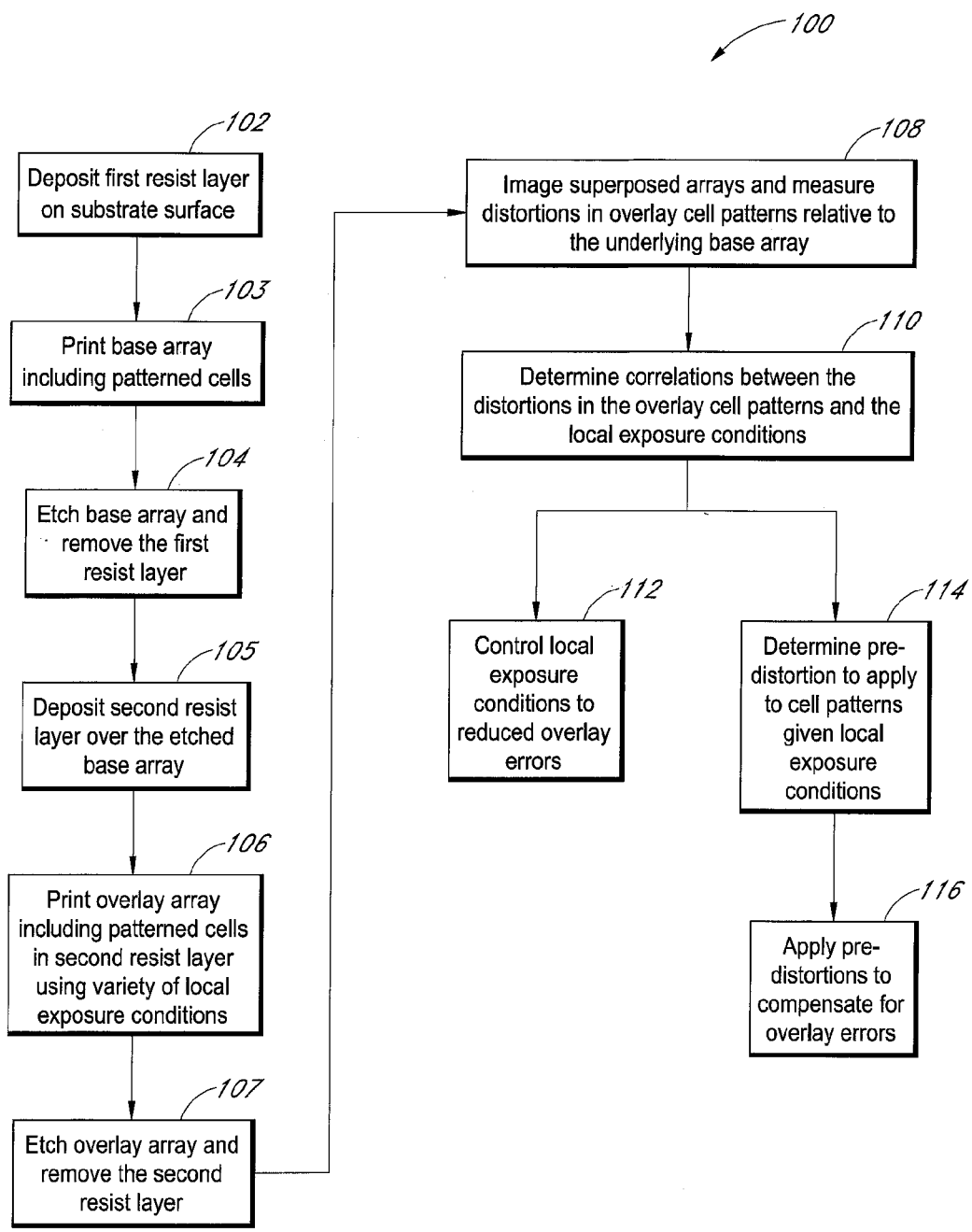
FIG. 1 is a flow diagram of a method for measuring and correcting overlay errors for an area-imaging e-beam lithography instrument in accordance with an embodiment of the invention.
Figure 2:
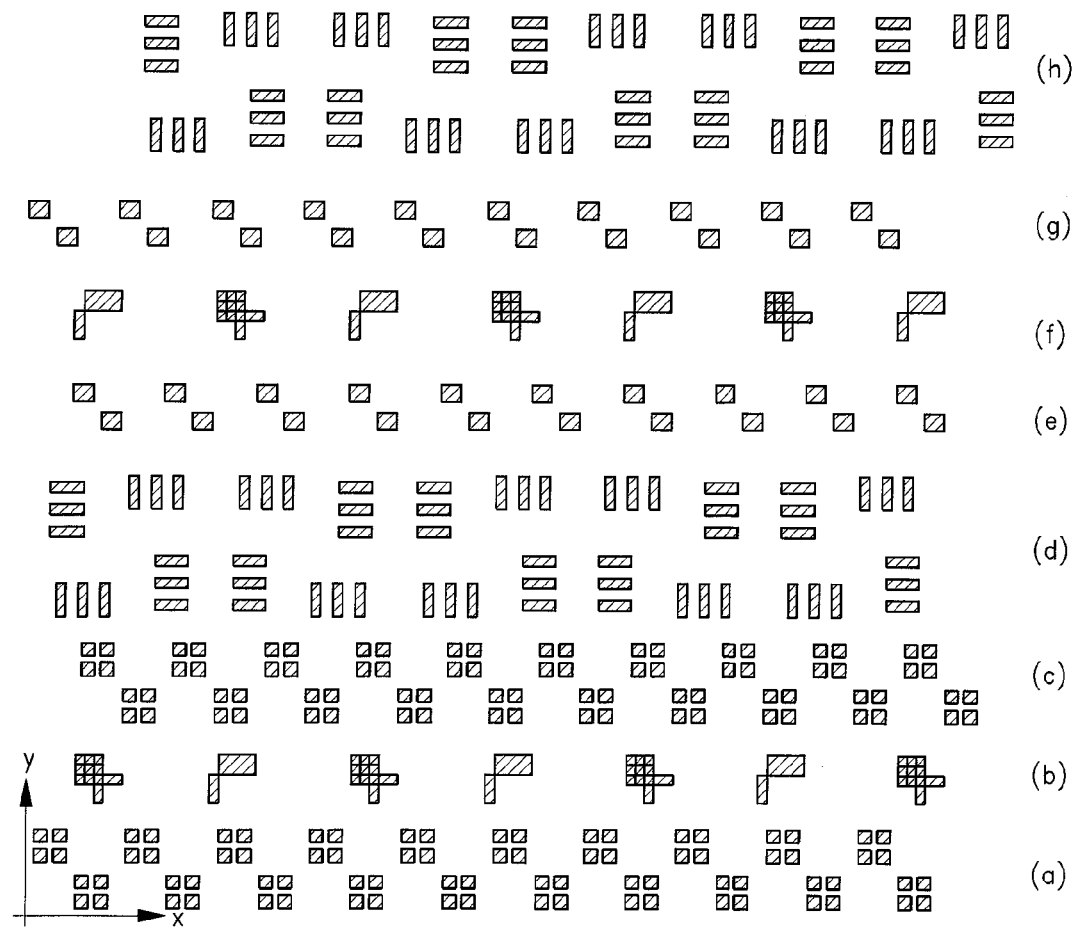
FIG. 2 depicts a base array of patterned cells that may be printed in a base layer in accordance with an embodiment of the invention.

FIG. 1 is a flow diagram of a method 100 for measuring and correcting overlay errors for an area-imaging e-beam lithography instrument in accordance with an embodiment of the invention. This method 100 provides for the quantitative measurement of overlay errors at many points within an e-beam lithography writing field area and under various local exposure conditions. The various local exposure conditions are used to identify and separate the overlay error sources. Local exposure conditions may then be controlled to reduce or minimize the overlay error, and/or pre-distortion of patterns may then be performed to compensate for the expected overlay errors Per block 102, a first resist layer (or a directly-patternable material layer) may be deposited on the substrate surface, such as the surface of a silicon wafer substrate. A base array of patterned cells (layer 1 pattern) may then be printed by exposure and development of the resist layer (or by direct printing into the directly-patternable material layer) per block 103. An illustrative example of a base array 200 of patterned cells is depicted in FIG. 2. The printing may be accomplished using, for example, the e-beam lithography instrument under minimal distortion conditions. Alternatively, a different lithography instrument may be used to print the base array. For example, an optical lithography instrument (such as a 193 nm or 248 nm lithography system) or an EUV (extreme ultraviolet) lithography system may be used to print the base array. Subsequently, per block 104, the base array may be etched into the silicon surface by a dry or wet etch process, and the patterned-resist layer (or the directly-patterned material layer) may then be removed. Alternatively, the step of block 104 may be skipped, and the base array may be used as printed in the patterned-resist layer (or the directly-patterned material layer).

Per block 105, a second resist layer (or a directly-patternable material layer) may then be deposited over the etched base array. Subsequently, per block 106, an overlay array (layer 2 pattern) may be printed by exposure and development of the resist layer (or by direct printing into the directly-patternable material layer). The overlay array may include patterned cells that are complementary to the patterned cells in the base array. An illustrative example of a overlay array 300 of complementary patterned cells is described above in relation FIG. 3, and a superposition of the overlay array 300 over the base array 200 is shown in FIG. 4. Thereafter, the overlay array may be etched and the patterned-resist layer (or the directly-patterned material layer) may then be removed per block 107. Alternatively, the step of block 107 may be skipped, and the overlay array may be used as printed in the patterned-resist layer (or the directly-patterned material layer).

The printing of the overlay array per block 106 may be performed with a variety of local exposure conditions. As described below in relation to FIGS. 5A-5H, the different local exposure conditions may involve adjacent areas within a swath being exposed with varying levels of electron beam intensity (beam current). The different local exposure conditions may also be achieved by varying electron beam column settings, such as lens voltages, focus levels, stigmator strengths, deflections, and other column settings, between swaths.

Per block 108, the superposed arrays may be imaged and distortions in the overlay array relative to the underlying base array may be measured. The base array of patterned cells effectively provides a reference background pattern relative to which the distortions in the printed overlay array may be measured. Such measurements may be made from image data of the two superimposed layers obtained by an optical imaging microscope, an ion microscope, or a high-resolution scanning electron microscope, for example. The overlay measurements may be made with the overlay and base arrays etched into the substrate or into a desired process layer material, or may be made with the overlay array (or both arrays) printed in a patterned-resist or directly-patterned layer.

Per block 110, correlations between the distortions in the overlay cell patterns and the local exposure conditions may be determined. For example, a same overlay cell pattern may be printed under various local exposure conditions, and the resultant printed cell patterns may be processed to determine distortions caused by the local exposure conditions. Based on these correlations, the local exposure conditions may be controlled during e-beam lithography to reduce overlay errors per block 112.

In addition, or alternatively, per block 114, a determination may be made of pre-distortion or pre-compensation to be applied to various cell patterns given different local exposure conditions to reduce the final overlay error. Finally, per block 116, such pre-distortions may be subsequently applied to patterns being written by the e-beam lithography instrument under the same or similar local exposure conditions.

Different target designs may work best under different wafer processing or measurement conditions. Smaller overlay targets allow denser placement of targets in the array and more information on pattern distortion, enabling better calculation of overlay corrections.

Figure 7:
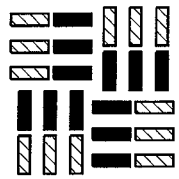
FIG. 7 depicts various embodiments of overlay measurement targets and examples of pattern recognition features that may be used assist in overlay measurements.
Figure 7:
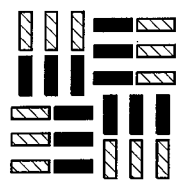
Figure 7:
Figure 7:
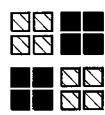
Figure 7:
Figure 7:
Figure 7:
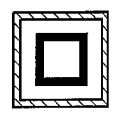
Figure 7:
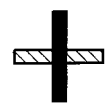
Figure 7:
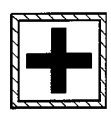

Exemplary targets are depicted in FIG. 7. The depicted targets include overlay targets (702, 704, 706, 708, 722, 724 and 726) and pattern recognition targets (710 and 712).

FIG. 2 depicts an exemplary base array 200 of patterned cells that may be printed in a base layer in accordance with an embodiment of the invention. In this example, eight rows (labeled a through h) are shown. Rows (a) and (c) contain the same patterned cells (each cell having a first part of overlay target 708), but the cells in row (c) are offset from the cells in row (a) by a fraction of the cell width. Similarly, rows (d) and (h) contain the same patterned cells (each cell having a first part of overlay targets 702 and 704), but the cells in row (h) are offset from the cells in row (d) by a fraction of the cell width, and rows (e) and (g) contain the same patterned cells (each cell having a first part of overlay cell 706), but the cells in row (g) are offset from the cells in row (e) by a fraction of the cell width. Rows (b) and (f) provide alignment patterns or pattern recognition marks in cells (each cell including marks 722 and 724) that may be used by the overlay metrology instrument for alignment purposes prior to the measurement of the overlay array 300.

Figure 3:
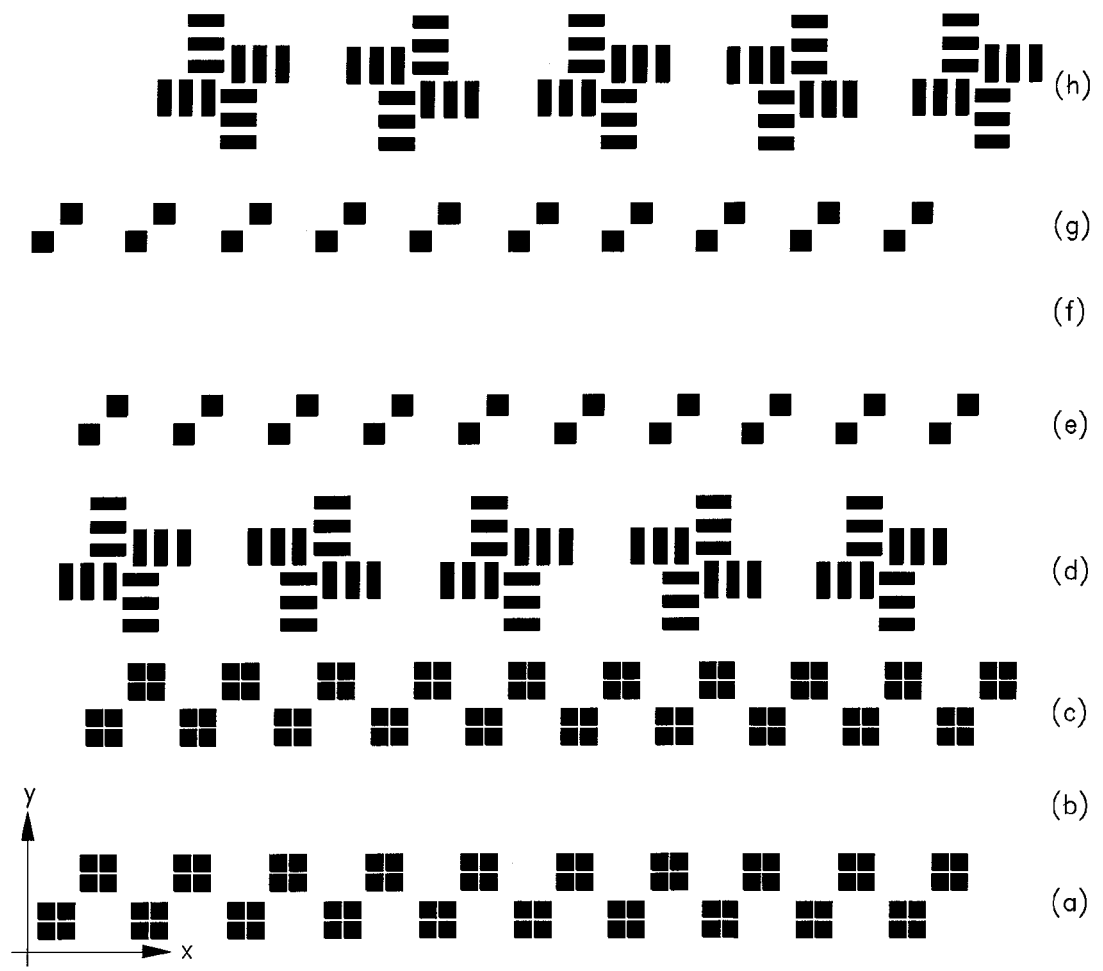
FIG. 3 depicts an overlay array of patterned cells that may be printed over the base layer in accordance with an embodiment of the invention.
Figure 4:
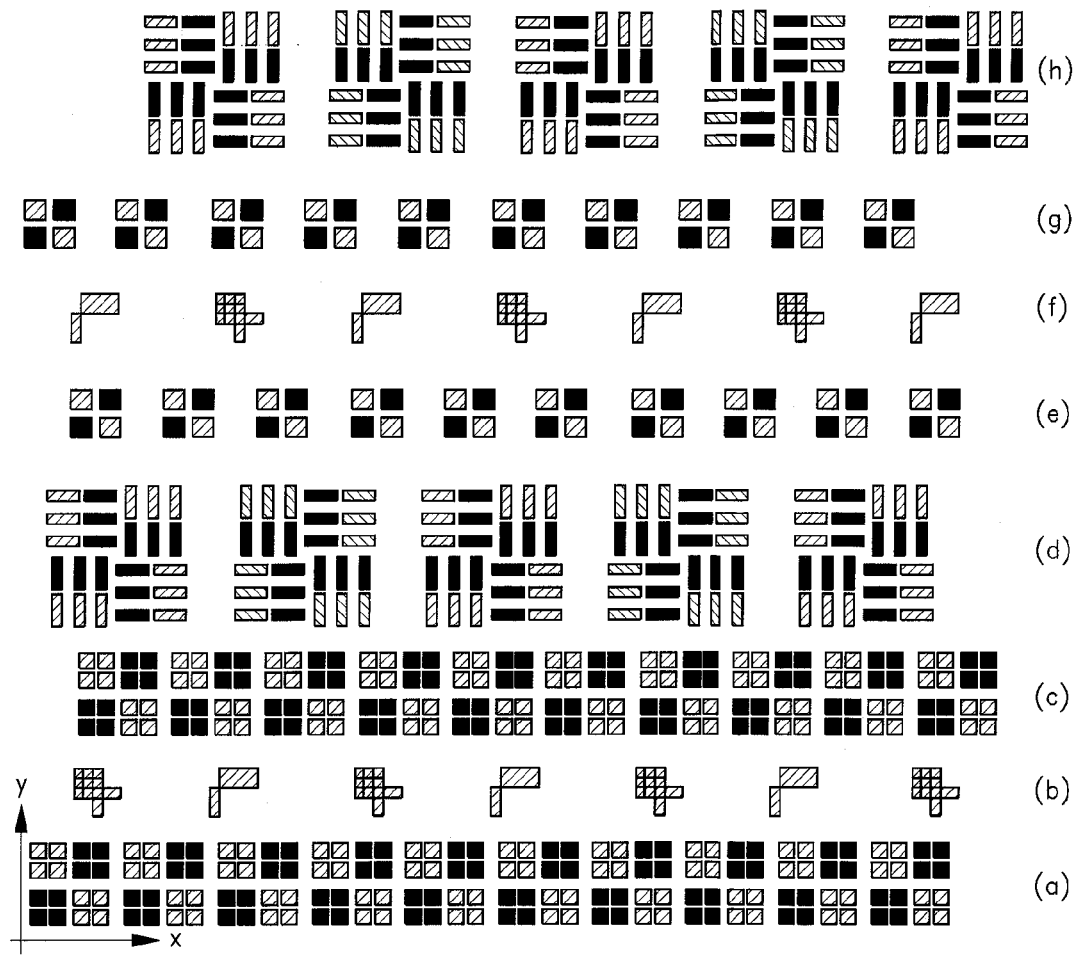
FIG. 4 depicts the overlay array of patterned cells superimposed over the base array of patterned cells in accordance with an embodiment of the invention.

FIG. 3 depicts an exemplary overlay array 300 of patterned cells ("target cells") that may be printed over the base layer in accordance with an embodiment of the invention. Similar to the base array 200, eight rows (labeled a through h) are shown in the overlay array 300. In this example, overlay array 300, rows (a) and (c) contain the same patterned cells (each cell having a first part of overlay target 708), but the cells in row (c) are offset from the cells in row (a) by a fraction of the cell width. Similarly, rows (d) and (h) contain the same patterned cells (each cell having a first part of overlay targets 702 and 704), but the cells in row (h) are offset from the cells in row (d) by a fraction of the cell width, and rows (e) and (g) contain the same patterned cells (each cell having a second part of overlay cell 706), but the cells in row (g) are offset from the cells in row (e) by a fraction of the cell width. Rows (b) and (f) are blank as they correspond to the rows in the base array 200 that are used for alignment.

Note that the overlay array 300 of FIG. 3 is designed to be printed by scanning a horizontally-oriented array of dynamically-controlled e-beamlet "pixels" in a vertical direction. Each e-beamlet pixel may be dynamically controlled to be either on (where the e-beamlet illuminates the pixel) or off (where the e-beamlet is blocked or diffracted so that it does not illuminate the pixel). The area covered by each such scan may be referred to as a vertical swath.

FIG. 4 depicts the overlay array 300 of patterned cells superimposed over the base array 200 of patterned cells in accordance with an embodiment of the invention. As shown in FIG. 4, the pattern in the cells in the overlay array 300 generally complement (and do not overlap with) the pattern in the cells of the base array 200. In this example, rows (a) and (c) contain the same 2-layer patterned cells (each cell having the overlay target 708), but the cells in row (c) are offset from the cells in row (a) by a fraction of the cell width. Similarly, rows (d) and (h) contain the same 2-layer patterned cells (each cell having overlay targets 702 and 704), but the cells in row (h) are offset from the cells in row (d) by a fraction of the cell width, and rows (e) and (g) contain the same 2-layer patterned cells (each cell having the overlay cell 706), but the cells in row (g) are offset from the cells in row (e) by a fraction of the cell width. Rows (b) and (f) contain the single-layer pattern recognition marks (each cell having the marks 722 and 724).

FIG. 5A through 5H depict eight exemplary swaths layouts (510, 520, 530, 540, 550, 560, 570 and 580, respectively) to print an overlay array in accordance with an embodiment of the invention. The eight swaths in FIGS. 5A-5H are each formed over a first layer pattern (base array) which underlies the entire swath. Each of the eight swath layouts of FIGS. 5A-5H is designed to be printed by scanning a horizontally-oriented array of dynamically-controlled e-beamlet pixels in a vertical direction. The area covered by each such scan may be referred to as a vertical swath. One vertical swath is depicted in each of FIGS. 5A-5H.

The eight swath layouts in FIGS. 5A-5H includes patterned areas 512 that are unshaded in the figures. These patterned areas 512 contain repeated cell patterns similar to the exemplary cell patterns in FIG. 3. As shown in the figures, the patterned areas 512 are organized in "macro rows" with an example macro row being outlined and labeled 514 in FIG. 5A. Each macro row of the patterned area 512 may include multiple rows of repeated cell patterns, such as the rows shown in FIG. 3, for example.

The latter seven swath layouts in FIGS. 5B-5H also include controlled-exposure areas (such as, 524, 534, 535, 536, 537, etc.) that are shaded (filled) in the figures. These controlled-exposure areas do not have the repeated cell patterns. As described below, these controlled-exposure areas may be used to controllably vary local exposure conditions within a swath.

Figure 5A:
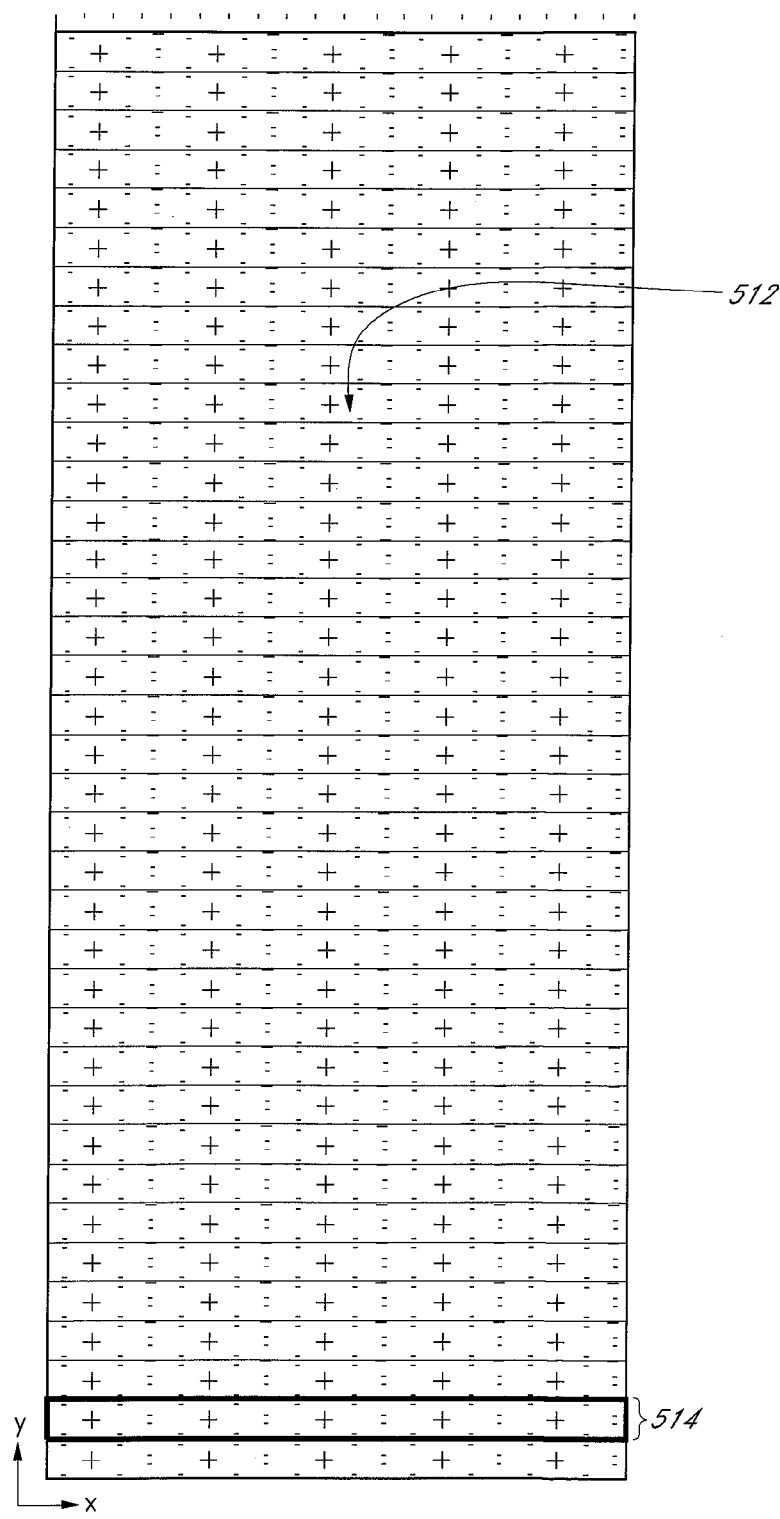
FIG. 5A through 5H depict eight exemplary swath layouts in accordance with an embodiment of the invention.

In the first exemplary swath layout 510 depicted in FIG. 5A, the patterned area 512 may be the entire area of the swath layout 510 and may include multiple macro rows. There are no controlled-exposure areas in this swath layout 510. As such, the local exposure conditions used to print each patterned cell may be considered to be relatively constant. This swath layout 510 may be printed using a nominal or a best known e-beam column configuration.

Figure 5B:
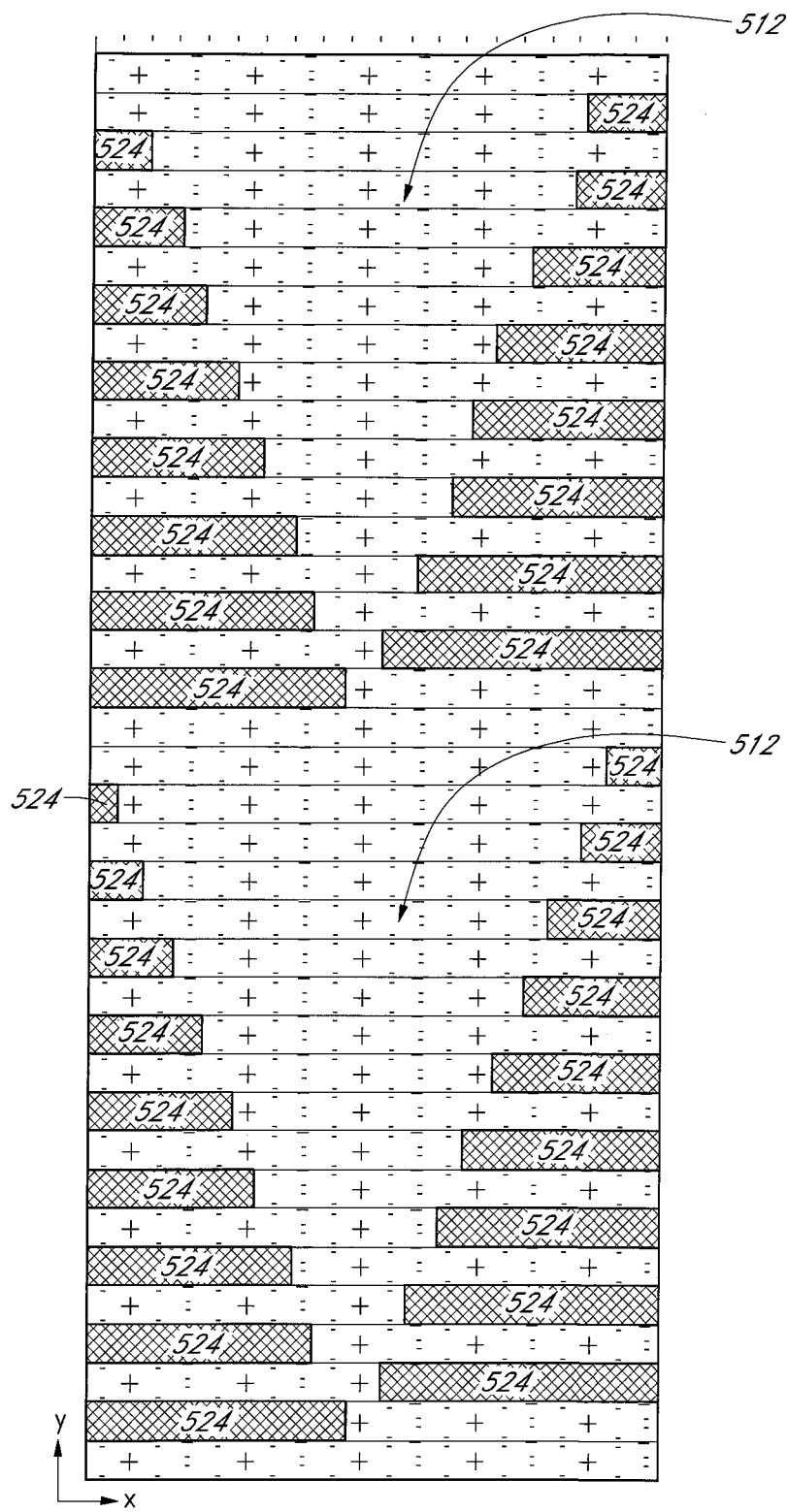

In the second exemplary swath layout 520 depicted in FIG. 5B, the patterned area 512 (including multiple macro rows) only partially covers the area of the swath layout 520. As seen in FIG. 5B, controlled-exposure areas 524 may each cover a segment of a macro row and may be asymmetrically distributed in the swath layout 520. In this case, the local exposure conditions used to print each cell in the patterned areas 512 may be considered to vary depending on the local proximity to the controlled-exposure areas 524 and the exposure setting for those areas 524.

For example, the controlled-exposure areas 524 may include fully-exposed cells (all pixels in the cell turned on), fully-blocked cells (all pixels in the cell turned off), or partially-exposed cells (a fraction of pixels turn on and the remaining pixels turned off in a well-distributed manner within the cell). In one specific example, the partially-exposed cells may be 50% exposed with a "checker board" pixel pattern. In the particular swath layout 520 illustrated in FIG. 5B, the controlled-exposure areas 524 are in the form of partial rows in the swath layout 520.

Figure 5C:
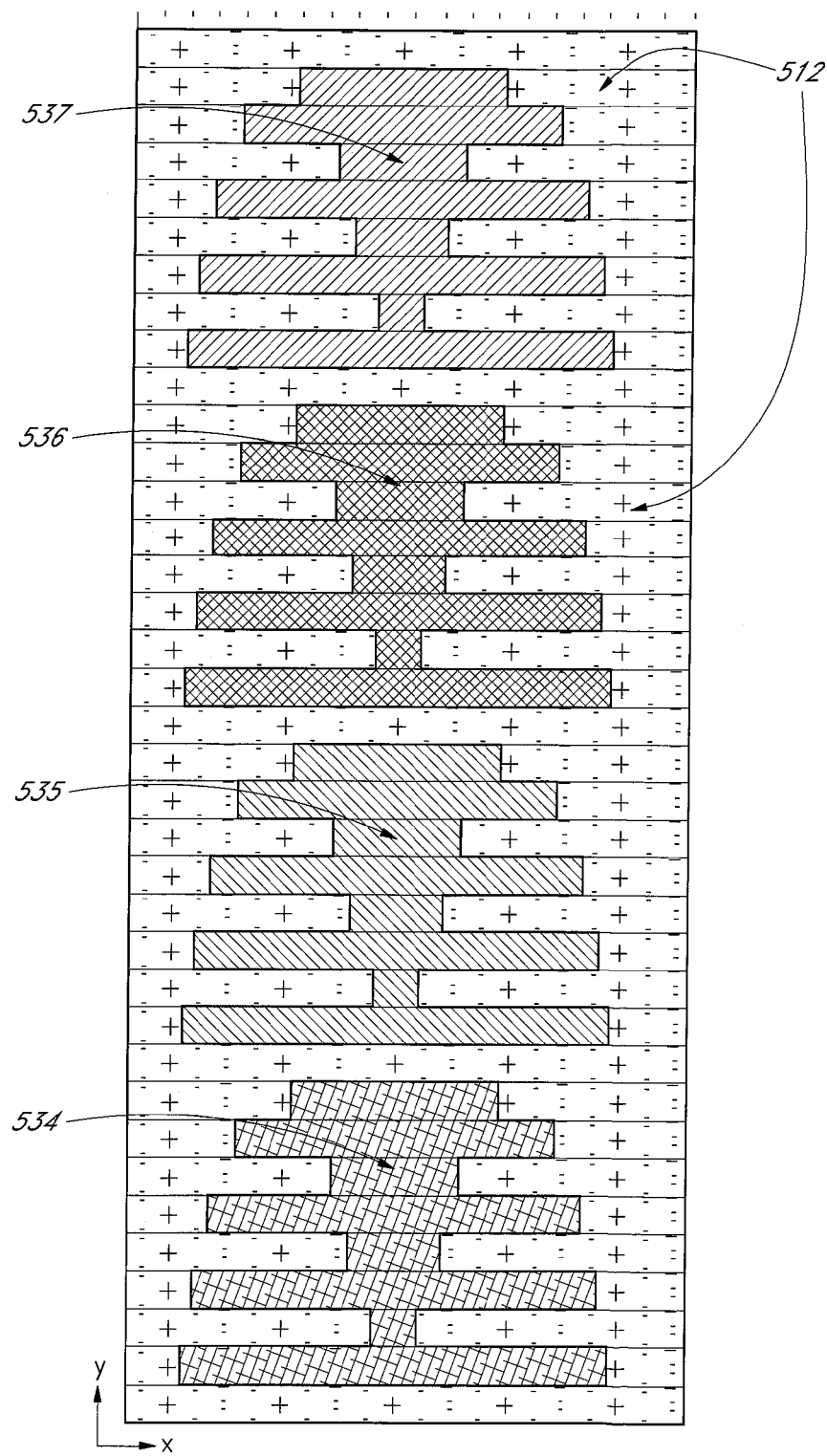

In the third exemplary swath layout 530 depicted in FIG. 5C, the patterned area 512 again only partially covers the area of the swath layout 530. As seen in FIG. 5C, there may be different controlled-exposure regions (534, 535, 536, and 537). In this example, each controlled-exposure region may each cover segments of multiple adjacent macro rows and may be symmetrically distributed in the swath layout 530, and each region may have a different fraction of pixels on in a distributed manner.

In one configuration, the first region 534 may have 100% of pixels turned on, the second region 535 may have 75% of pixels turned on, the third region 536 may have 50% of its pixels turned on, and the fourth region 537 may have 25% of its pixels turned on. In another configuration, the first region 534 may have 100% of pixels turned on, the second region 535 may have 75% of pixels turned on, the third region 536 may have 50% of its pixels turned on, and the fourth region 537 may have 0% of its pixels turned on. Various other configurations are also possible.

Figure 5D:
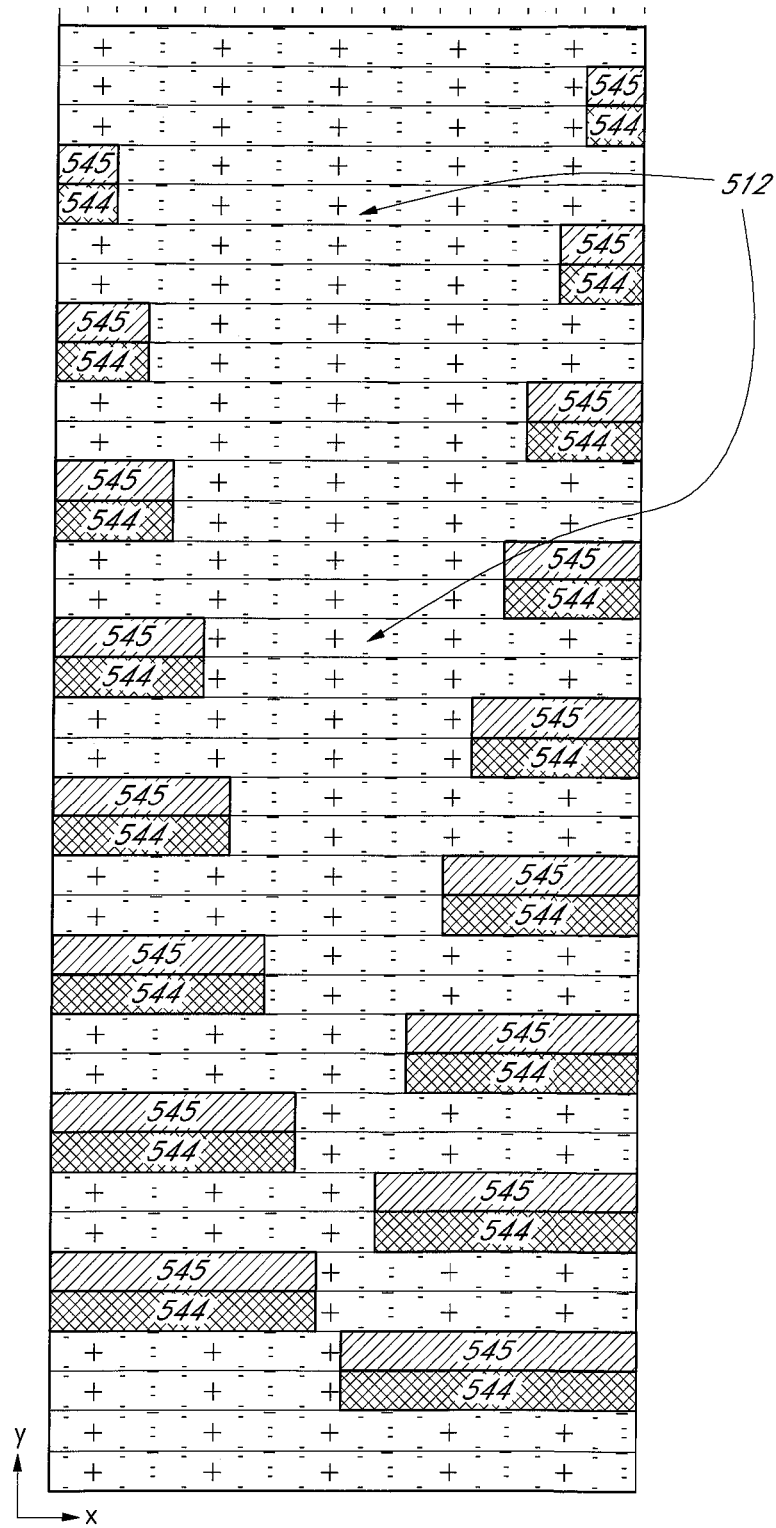

In the fourth exemplary swath layout 540 depicted in FIG. 5D, the patterned area 512 again only partially covers the area of the swath layout 540. As seen in FIG. 5D, there may be controlled-exposure regions with two different levels of exposure (544 and 545) covering segments of pairs of adjacent macro rows in an alternating asymmetric pattern. For example, the first level of exposure (544) may have 100% of the pixels on, and the second level of exposure may have 0% of the pixels on (545). In this case, alternating the magnitudes of the influences of space charge may be used for separation or isolation of the space charge contributions to the overlay errors.

Figure 5E:
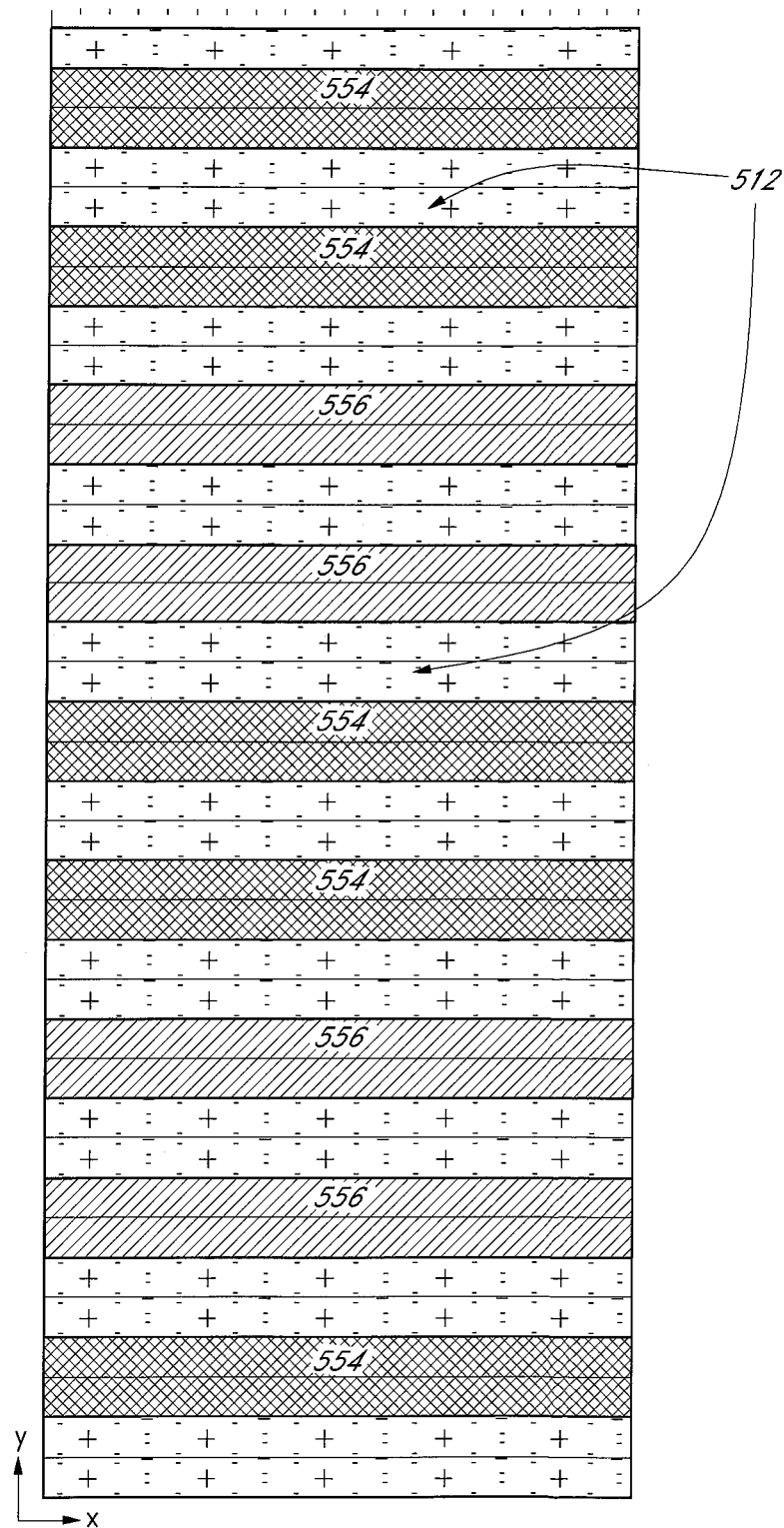

In the fifth exemplary swath layout 550 depicted in FIG. 5E, the patterned area 512 again only partially covers the area of the swath layout 550. As seen in FIG. 5E, there may be controlled-exposure areas (554 and 556) with two different levels of exposure, where each controlled-exposure area covers the entire width of a pair of adjacent macro rows. In this case, there are two macro rows of patterned area 512 separating the controlled exposure areas. For example, the first level of exposure (areas 554) may have 100% of the pixels on, and the second level of exposure may have 0% of the pixels on (areas 556). In this case, the overlay errors should be relatively constant in the x (horizontal) direction, especially for the patterned cells (target cells) near the center of the swath width. Meanwhile, the overlay errors may vary substantially in the y (vertical) direction for the patterned cells depending on the adjacent charge density and the distance from the charge density. For example, it is expected that the overlay errors may be measurably different for the patterned cells nearby full-exposure areas 554 when compared against the overlay errors for the patterned cells nearby fully-blocked (zero-exposure) areas 556.

Figure 5F:
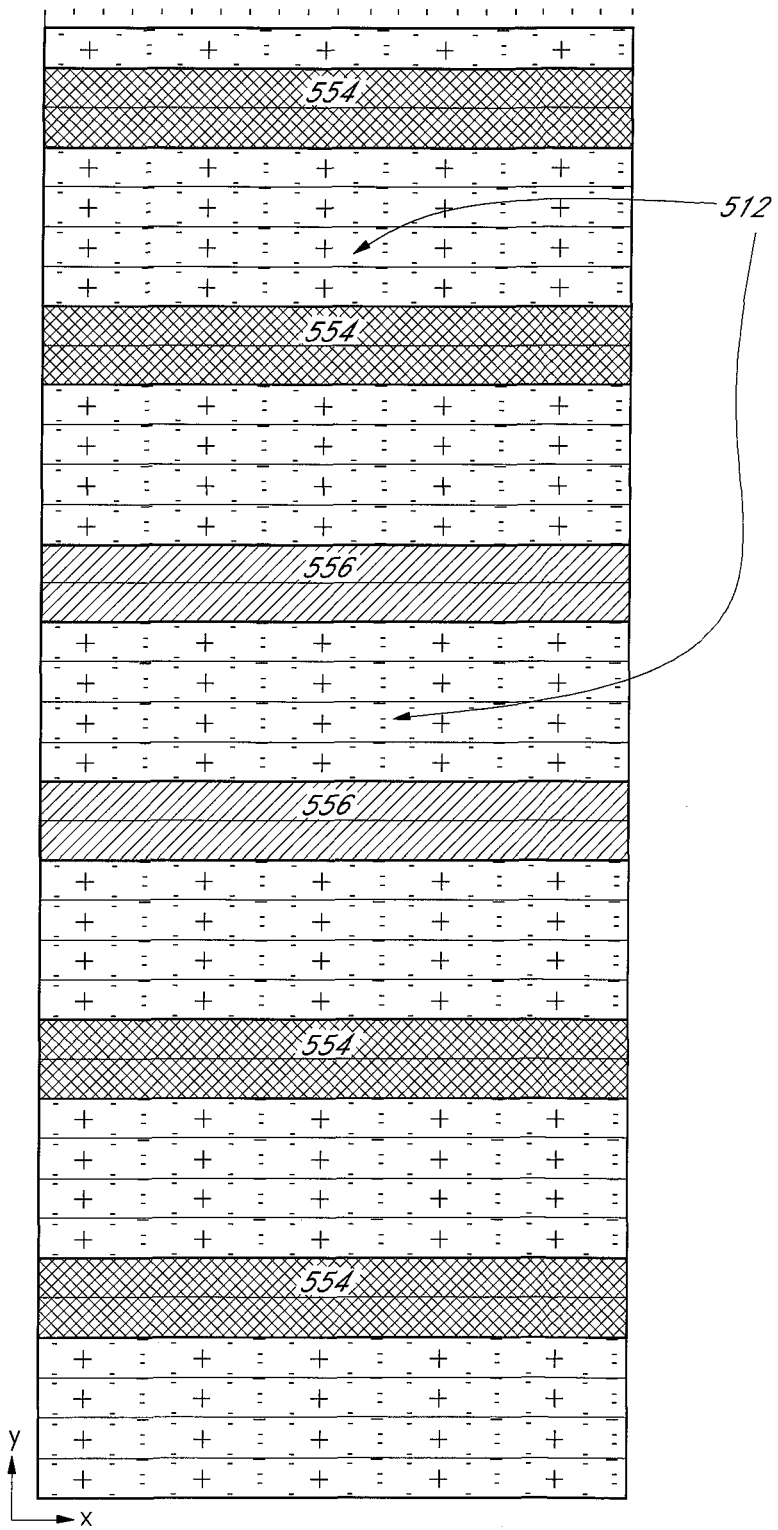

In the sixth exemplary swath layout 560 of FIG. 5F is similar to the fifth exemplary swath layout 550 of FIG. 5E. The difference is that, in this case, there are four macro rows of patterned area 512 separating the controlled exposure areas. By comparing the overlay errors in FIGS. 5E and 5F, distance scaling of the y-direction overlay errors may be determined.

Figure 5G:
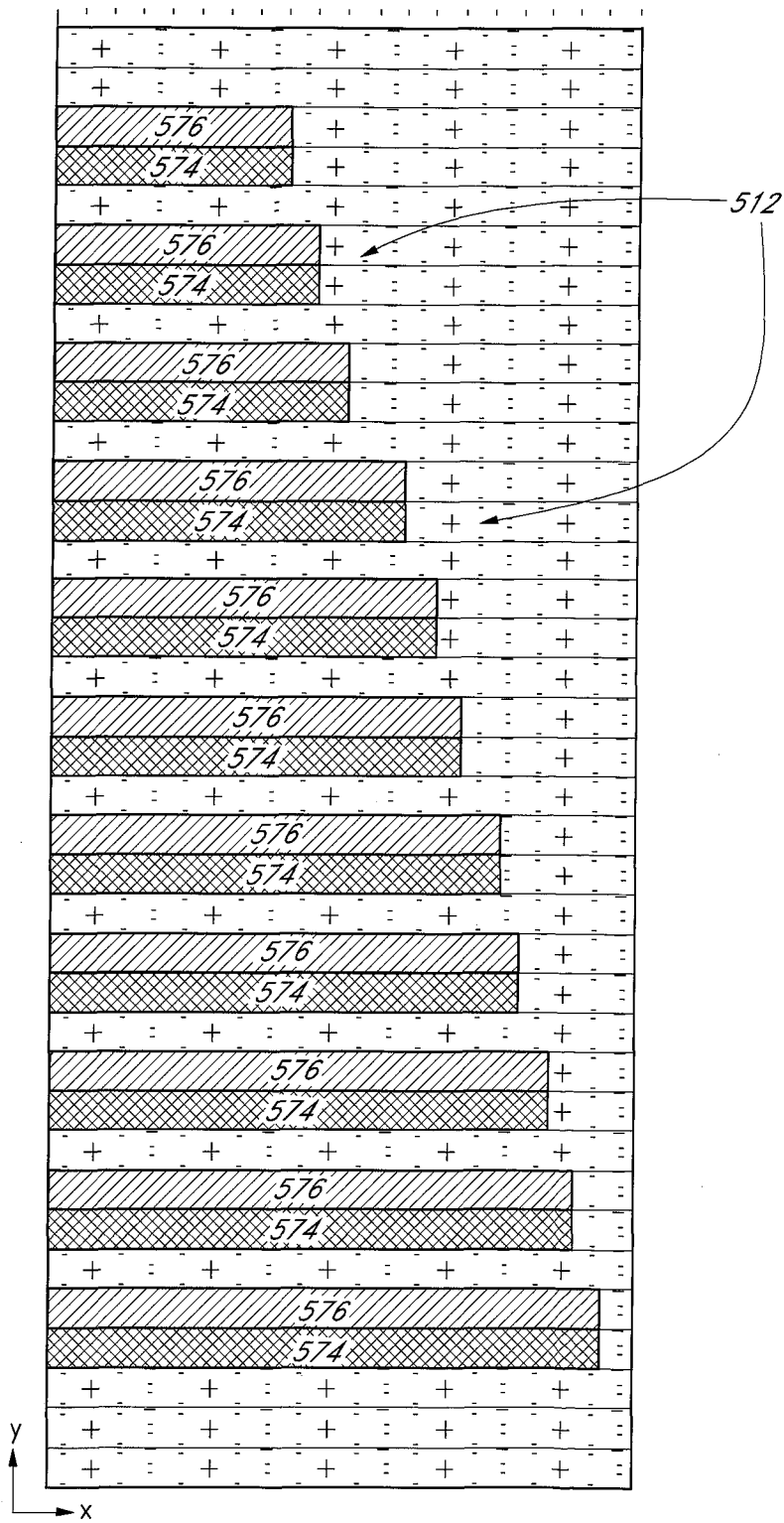
Figure 5H:
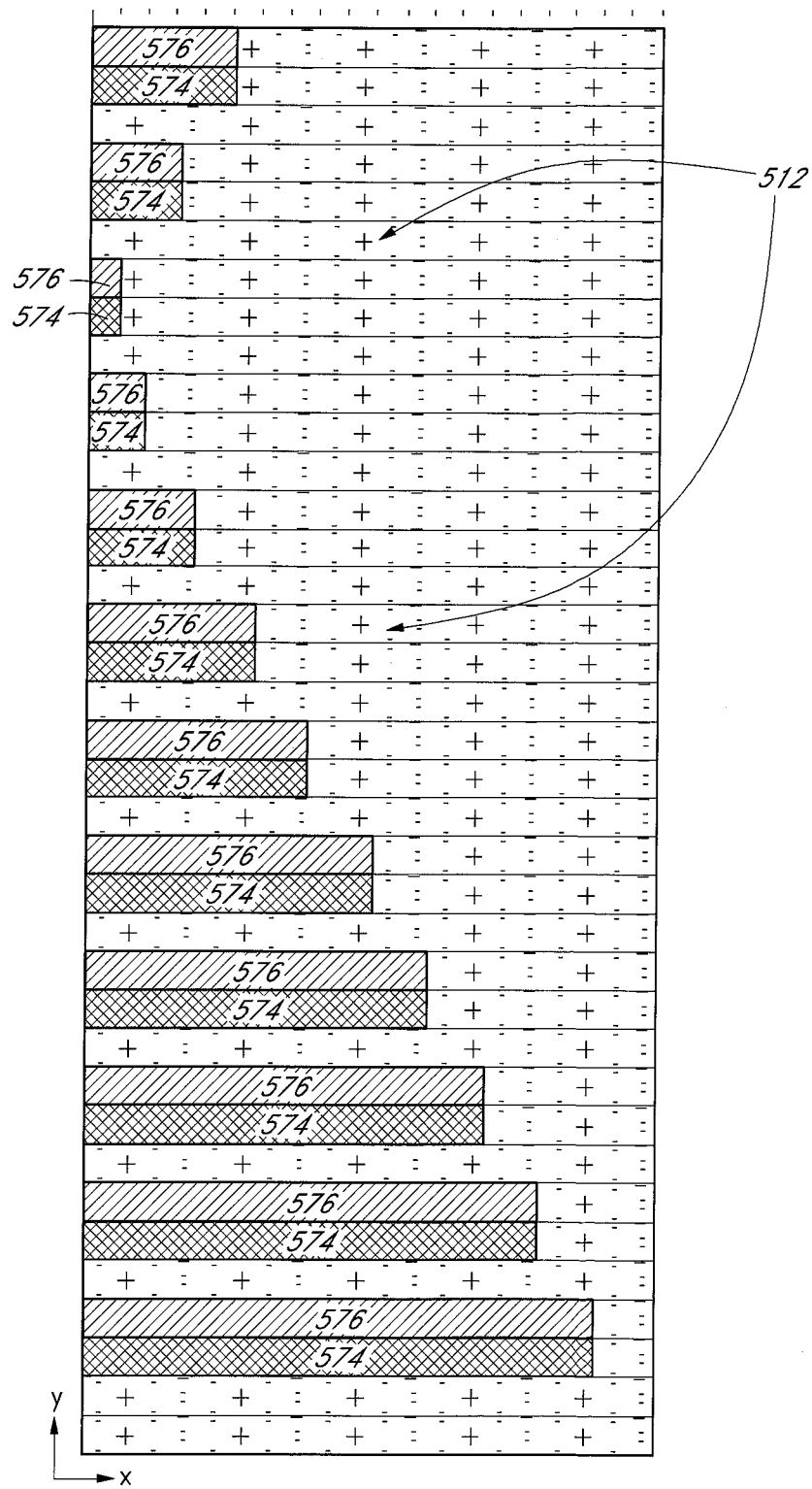

The seventh and eighth exemplary swath layout (570 and 580) of FIGS. 5G and 5H, respectively, show other examples of asymmetric distributions of the controlled-exposure areas (574 and 576) with alternating exposure levels covering segments of pairs of adjacent macro rows. For example, the first level of exposure (areas 574) may have 100% of the pixels on, and the second level of exposure may have 0% of the pixels on (areas 576).

While the exemplary swath layouts discussed above vary local exposure levels at different positions to determine their effect on overlay errors within a swath, other e-beam column settings may also be varied to determine their effect on overlay errors. In an exemplary embodiment, these e-beam column settings may be varied between swaths (for example, with one setting in one swath and another setting in an adjacent swath) in a manner such that the effect of each setting on the overlay errors may be isolated. Such e-beam column settings may include lens voltages, beam current, focus strengths, stigmation strength, deflection strength, and so on.

Figure 6:
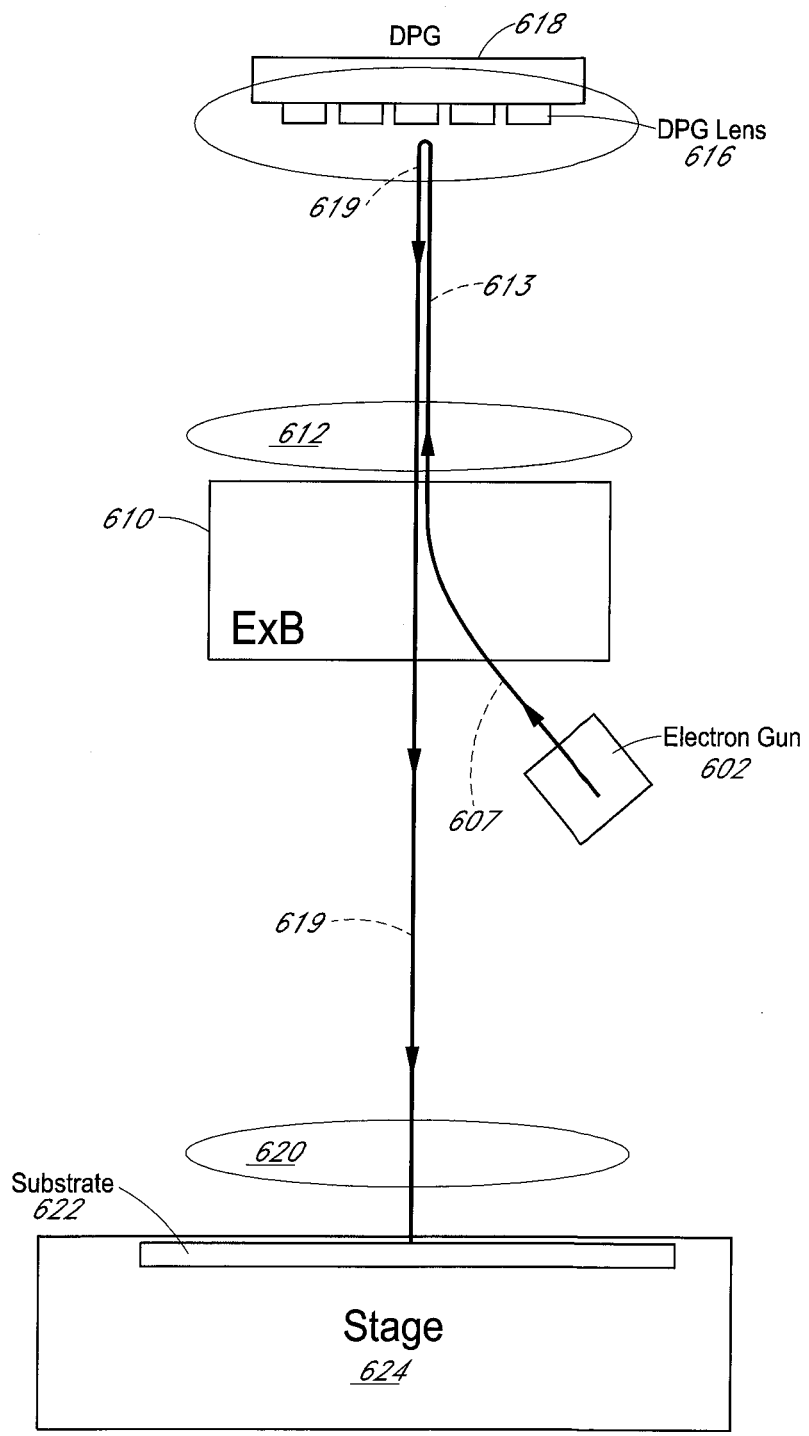
FIG. 6 is a cross-sectional diagram of an area-imaging e-beam lithography instrument in accordance with an embodiment of the invention.

FIG. 6 is a cross-sectional diagram of an area-imaging e-beam lithography instrument in accordance with an embodiment of the invention. As depicted, an electron gun 602 may be configured to output an electron beam 607 towards an ExB separator 610. The ExB separator 610 may be a Wien filter and may be arranged just below a first demagnification (demag) lens 612 and may be arranged to bend or deflect the trajectory of the electron beam 607 towards a dynamic pattern generator (DPG) 618. This deflection occurs because the velocity of the electrons comprising the electron beam is predominantly in such a direction so that the electric force and magnetic force of the ExB separator (which are of equal value) add, doubling the deflection force.

A first demagnification (demag) lens 612 may focus the re-directed electron beam 613 so as to form a crossover above the first demag lens 612 and form a magnified image of the cathode onto the DPG 618. The DPG lens 616 may be an electrostatic lens which decelerates the electrons of the re-directed electron beam 613 to within a few volts of the cathode potential. The DPG lens 616 may be, for example, an immersion cathode lens which is configured to deliver an effectively uniform current density (i.e. a relatively homogeneous flood beam) over a large area in a plane at the surface of the DPG 618.

The DPG 618 may include a two-dimensional array of pixels. Each pixel may include an electrically conductive contact to which a voltage level is controllably applied. Alternatively, the dynamic pattern generator may be replaced by another patterned electron reflector, such as, for example, a static patterned electron reflector in which the pattern is not dynamically configurable.

As the reflected electrons 619 leave the DPG 618, the DPG lens 616 re-accelerates the reflected electrons 619 toward their second pass through the first demag lens 612 and the ExB separator 610. The ExB separator 610 is configured to receive the reflected electrons 619 from the first demag lens 612 and to pass (without deflection) the reflected electrons towards the second (final) demag lens 620. The projection axis (vertical in FIG. 6) going from the DPG 618 to the stage 624 may be straight as depicted.

The final demag lens 620 may be positioned between the ExB separator 610 and the target substrate 622. The final demag lens 620 may be configured to focus the reflected electron beam 619 and demagnify the beam onto a surface of the target substrate 622. The target substrate 622 may be, for example, a semiconductor wafer with a photoresist layer on its surface The blur and distortion due to the final demag lens 620 is preferably a fraction of the pixel size. The substrate stage 624 holds the target substrate 622. In one embodiment, the stage 624 is stationary during the lithographic projection. In another embodiment, the stage 624 is in motion during the lithographic projection. In the case where the stage 624 is moving, during the lithographic projection, the pattern on the DPG 618 may be dynamically adjusted to compensate for the motion such that the projected pattern moves in correspondence with the wafer movement. The stage 624 may be configured for linear motion or rotary motion.

While the above description provides overlaying layers for performing an imaging overlay measurement, non-imaging overlay measurement methods may be used to measure the overlay variation across the swath width in accordance with an alternate embodiment. The non-imaging overlay measurement methods may include using a scatterometry overlay or a diffraction based overlay.

Figure 8:
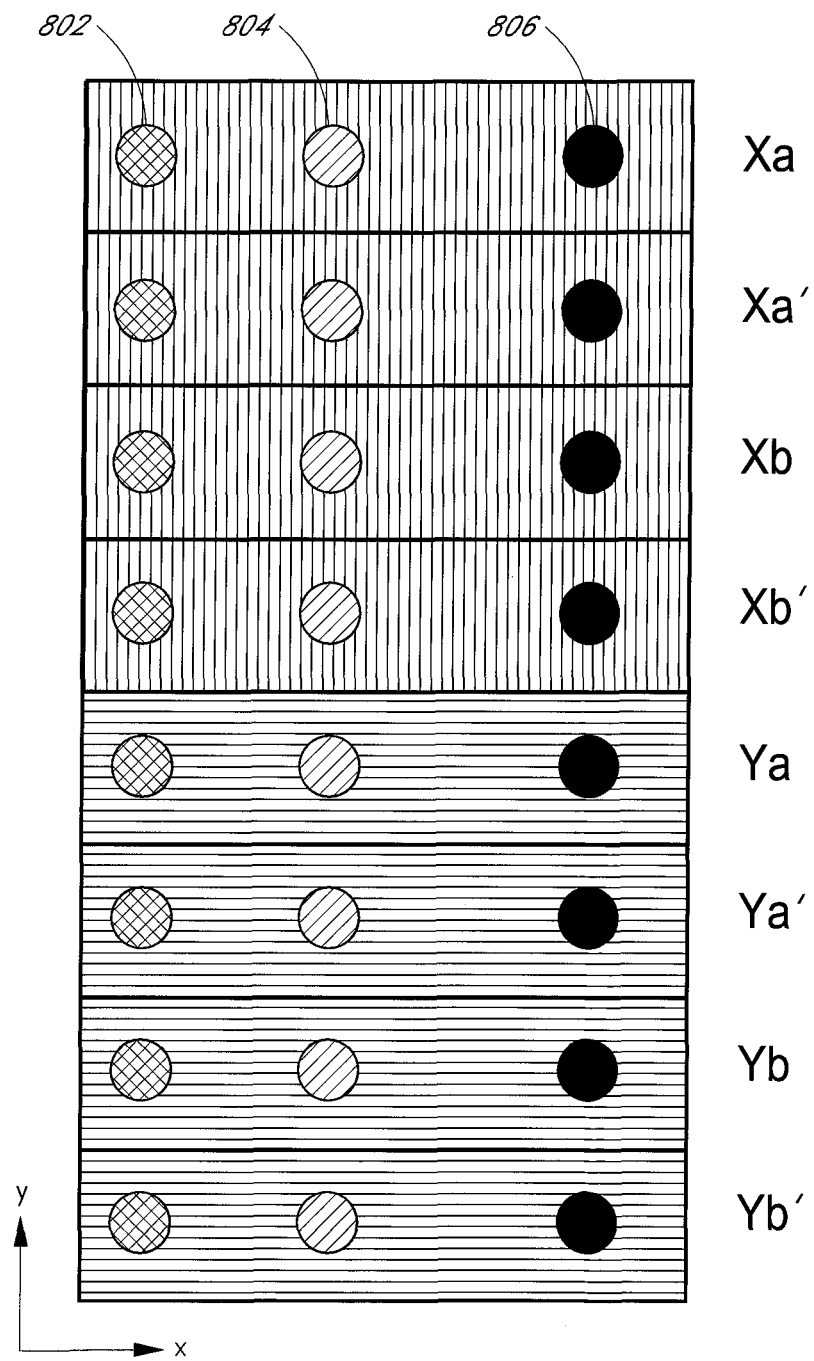
FIG. 8 depicts scatterometry overlay target gratings arranged to be printed along the along the swath scanning direction.

FIG. 8 shows scatterometry overlay grating structures arranged along the swath scanning direction ("Y"). These scatterometry overlay target grating structures may be arranged to be printed along the swath scanning direction (direction Y) over the base array of patterned cells.

As further shown in FIG. 8, the overlay grating structures may include gratings oriented in the X direction (rows Xa, Xa', Xb, Xb') and gratings oriented in the Y direction (rows Ya, Ya', Yb, and Yb'). The gratings labeled Xa, Xa' Xb, and Xb' may correspond to different SCOL target cell X offsets, while the gratings labeled Ya, Ya' Yb, Yb' may correspond to different SCOL target cell Y offsets.

Measurements are made of signals from the scatterometry overlay cells at different X positions to get overlay as function of X in the swath. A first series (or group) of measurement locations 802 may comprise one scatterometry overlay measurement at a first X location. A second series (or group) of measurement locations 804 may comprise one scatterometry overlay measurement at a second X location. A third series (or group) of measurement locations may comprise one scatterometry overlay measurement at a third X location. For each of these scatterometry overlay measurements, the Y location of the measurement may be considered to be the average Y location of the scatterometry signal measurements. In a preferred embodiment, the measurement illumination spots are as small as practical and measured at a series of X locations as densely spaced as possible, e.g. at a spot size of 3 microns and with a separation between adjacent X location in the series of 3 to 5 microns (i.e. $X_{n+1}-X_n$=3-5 microns). In one implementation, there may be 20 to 30 or more $X_i$ measurement locations.

In this embodiment, instead of many individually-defined grating targets disposed along the swath width, one continuous grating structure is written along the swath width, and the scatterometry overlay measurements are made at multiple X locations along the swath width. The non-imaging overlay measurement method may be in accordance with the method disclosed in U.S. Pat. No. 7,564,557, which is hereby incorporated by reference in its entirety. The overlay values obtained from measurements at different X locations will vary if the overlay error is varying across the swath width.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of measuring overlay errors for an programmable pattern, area-imaging electron beam lithography instrument, the method comprising:
   printing a base array, including first patterned cells, on a surface of a substrate;
   printing an overlay array, including second patterned cells, in swaths over the base array using the area-imaging electron beam lithography instrument, wherein electron beam column conditions of the electron beam lithography instrument are varied between swaths during the printing of the overlay array;

obtaining overlay-error-indication data of the overlay array superposed over the base array; and measuring the overlay errors from the overlay-error-indication data.

2. The method of claim 1, wherein the overlay-error-indication data comprises scatterometry data.

3. The method of claim 1, wherein the overlay-error-indication data comprises image data.

4. The method of claim 3, wherein the base array is printed by forming a patterned layer.

5. The method of claim 4 further comprising:
etching the base array through the patterned layer into the surface; and
removing the patterned layer.

6. The method of claim 3, wherein the overlay array is printed by forming a patterned layer.

7. The method of claim 6, further comprising:
etching the overlay array through the patterned layer into the surface; and
removing the patterned layer.

8. The method of claim 3, wherein macro rows of the base and overlay arrays include rows of repeated cells, and wherein the printing of the overlay array is performed by scanning a horizontally-oriented dynamically-controlled array of beamlets in a vertical direction.

9. The method of claim 3, wherein the overlay array further includes controlled-exposure areas within a swath.

10. The method of claim 9, wherein a controlled-exposure area has controlled distribution of beam current and a controlled total beam current.

11. The method of claim 9, wherein the controlled-exposure areas include areas of full exposure and areas of minimum exposure where pixels are in an off state.

12. The method of claim 11, wherein the controlled-exposure areas further include areas of partial exposure, and wherein the controlled-exposure areas comprise a first area formed with a first percent of pixels turned on, a second area formed with a second percent of pixels turned on, and a third area formed with a third percent of pixels turned on, wherein the first percent is greater than the second percent, and the second percent is greater than the third percent.

13. The method of claim 9, wherein the controlled-exposure areas are asymmetrically-distributed within the swath.

14. The method of claim 9, wherein the controlled-exposure areas cover segments of macro rows in the overlay array.

15. The method of claim 3, further comprising:
determining correlations between distortions in the second patterned cells in the overlay array relative to local exposure conditions.

16. The method of claim 15, further comprising:
controlling local exposure conditions to reduce overlay errors in subsequent printing by the instrument.

17. The method of claim 15, further comprising:
determining and applying pre-distortion to a pattern to minimize overlay errors.

18. The method of claim 17, wherein the overlay errors are measured after resist development, after etch, or on device.

19. A method of measuring overlay errors for an area-imaging electron beam lithography apparatus, the method comprising:
printing a first array, including patterned cells, on a surface of the substrate;
printing a second array, including complementary patterned cells, in swaths on the surface of the substrate such that the complementary patterned cells of the second array are superposed on patterned cells of the first array, wherein electron beam column conditions of the area-imaging electron beam lithography apparatus are varied between swaths during the printing of the second array;
obtaining image data of the superposed cells of the first and second arrays; and
measuring overlay errors based on distortions of the second array relative to the first array in the image data.

20. The method of claim 19, wherein one or more swaths include areas having controlled exposure levels, wherein the areas having controlled exposure levels comprise a first area formed with a first percent of pixels turned on, a second area formed with a second percent of pixels turned on, and a third area formed with a third percent of pixels turned on, wherein the first percent is greater than the second percent, and the second percent is greater than the third percent.

21. The method of claim 20, wherein at least one swath includes an asymmetrical distribution of the areas having controlled exposure levels.

* * * * *